CRYSTAL-CONTROLLED GROUNDED EMITTER OSCILLATOR

Original Filed Dec. 27, 1967

United States Patent Office

Re. 27,428
Reissued July 11, 1972

27,428

CRYSTAL-CONTROLLED GROUNDED EMITTER OSCILLATOR

Fumio Watase, Tokyo, Japan, assignor to Tohoku Oki Electric Company

Original No. 3,462,710, dated Aug. 19, 1969, Ser. No. 693,919, Dec. 27, 1967. Application for reissue Jan. 22, 1971, Ser. No. 109,066
Claims priority, application Japan, Jan. 12, 1967 (utility model), 42/3,150
Int. Cl. H03b 5/36
U.S. Cl. 331—116 R 3 Claims

Matter enclosed in heavy brackets [ ] appears in the original patent but forms no part of this reissue specification; matter printed in italics indicates the additions made by reissue.

ABSTRACT OF THE DISCLOSURE

In a grounded emitter type transistor oscillator with its operating point set at a low source voltage means is provided to delay the shift of the operating point toward the saturation region when the source voltage is increased rapidly in a short time whereby to satisfy the condition for initiating oscillations.

This invention relates to a grounded emitter type transistor oscillator.

Generally, in a grounded emitter type transistor oscillator with its operating point set at a low source voltage, when the source voltage is increased rapidly in a short time, the oscillation condition of the oscillator is not met whereby it can not oscillate.

Accordingly it is an object of this invention to provide a novel grounded emitter type transistor oscillator capable of providing positive oscillations when the operating point thereof is set at a low source voltage and when the source voltage is increased rapidly in a short time.

Another object of this invention is to provide a grounded emitter type transistor oscillator having simple and inexpensive circuit construction but which can oscillate at low source voltages.

These and further objects of this invention can be achieved by providing a grounded emitter type oscillator comprising a transistor, a source, a collector resistor, a base resistor, an emitter resistor and an oscillating element wherein the operating point is set at a low voltage, characterized in that said base resistor is divided into a first resistor element and a second resistor element, that a capacitor is connected between the junction of said first and second base resistor elements and the source whereby to delay the base current with respect to the instant of applying the source voltage.

This invention can be more fully understood from the following detailed description taken in connection with the accompanying drawing in which.

Figure 1:
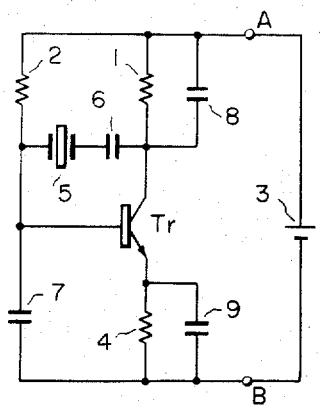
FIG. 1 PRIOR ART
FIG. 1 shows a connection diagram of a conventional grounded emitter type transistor oscillator.

Referring now to FIG. 1 which shows a conventional grounded emitter type transistor oscillator circuit employing a quartz oscillating element, the collector current and the base current of a transistor $T_r$ being supplied from a source of supply 3, respectively, through a collector resistor 1 and a base resistor 2. The emitter electrode of the transistor $T_r$ is connected to the source via an emitter resistor 4. A series circuit including a quartz oscillating element 5 and a capacitor 6 is connected between the collector electrode and the base electrode of transistor $T_r$. A capacitor 7 is connected between the base electrode of transistor $T_r$ and one terminal B of the source 3 while capacitors 8 and 9 are connected in parallel with collector resistor 1 and emitter resistor 4, respectively.

In the oscillating circuit shown in FIG. 1, the operation of which is equivalent to that of a known Colpitts type oscillator, it is now assumed that resistance values of collector resistor 1, base resistor 2 and emitter resistor 4 are denoted by $R_1$, $R_2$ and $R_3$, respectively, and that the voltage across the base and emitter electrodes of the transistor is denoted by $V_{EB}$, then the collector potential of the transistor $T_r$ as seen from terminal B, or the voltage $V_p$ of the DC operating point can be expressed by the following equation:

$$V_p=\frac{R_2+h_{FE}(R_3-R_1)}{h_{FE}}\times I_c+V_{EB}=K\times I_c+V_{EB}$$

where $$K=\frac{R_2+h_{FE}(R_3-R_1)}{h_{FE}}$$

In the above equation $h_{FE}$ represents the DC amplification factor of transistor $T_r$ and $I_c$ the collector current. It will be clear that if $h_{FE}$ were maintained constant with respect to collector current $I_c$, K would become a constant.

Figure 3:
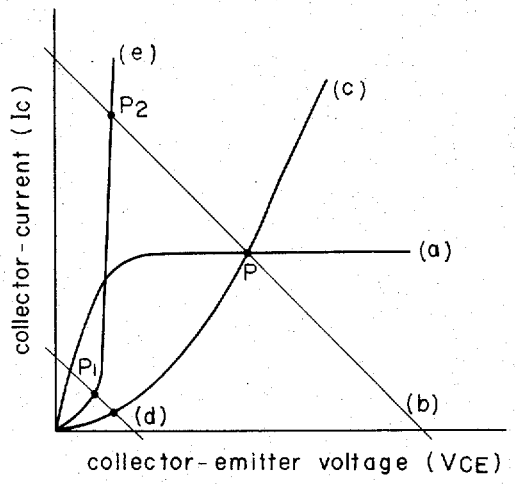

FIG. 3 shows the operating characteristics of the oscillator circuit shown in FIG. 1 wherein curve a represents a plot of collector-emitter voltage vs. collector current by taking the base current of the transistor as the parameter. Curve b represents the DC load characteristics of the collector electrode of the transistor $T_x$ and the point of intersection P between curves a and b represents the operating point of the oscillator. The locus of the operating point P when the base current of the transistor $T_r$ is varied is shown by curve C. Similarly curve d represents the DC load characteristic of the collector electrode of the transistor $T_r$ for the case wherein the source voltage is lower than that of the case shown by curve b. The locus of the operating point when it is set at such a low source voltage is shown by curve e. Stated in another way, it may be said that curve e corresponds to the case wherein the constant K in the above equation is smaller than that of the case shown by curve c.

In the oscillating circuit shown in FIG. 1, when the circuit is operating under a low source voltage its set operating point can be obtained on curve d shown in FIG. 3 which means that the corresponding constant K should be small. It is assumed now that the set operating point is denoted by $P_1$. Under this condition, when the source voltage is gradually increased the condition for initiating oscillation could be satisfied thus providing satisfactory oscillations. If the source voltage of a large magnitude were applied in the form of a pulse (or a step) the operating point $P_1$ will be quickly moved to point $P_2$ thus approaching the saturation region. In other words, in an oscillation circuit with the constant K set to a small value, a rapid increase in the source voltage causes the operating point to approach the saturation region, which means a relative decrease in the amplification factor of transistor $T_r$ included in the oscillation circuit. As a result, it becomes impossible to satisfy the condition of initiating oscillations in the oscillation circuit thus disabling the same.

In order to eliminate this difficulty, in accordance with this invention, in an oscillation circuit with its operating point set at a low source voltage, there is provided means to delay the shift of the operating point to the saturating region when the source voltage is quickly increased in a short time whereby to satisfy the condition for initiating oscillations.

Figure 2:
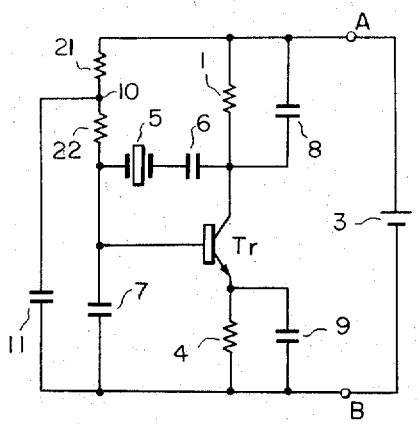
FIG. 2 shows a connection diagram of one embodiment of the novel grounded emitter type transistor oscillator and FIG. 3 is a graph showing operating characteristics of the grounded emitter type oscillator.

FIG. 2 illustrates one example of the ground emitter type oscillator circuit embodying this invention which is substantially identical to that shown in FIG. 1 except that the base resistor 2, shown in FIG. 1 is divided into two sections, i.e., resistors 21 and 22 and that a capacitor 11 is connected between the junction 10 between these divided resistors and terminal B of source 3. With this arrangement, the base current of transistor $T_r$ will be delayed with respect to the instant of application of the source voltage whereby the interval of time in which the operating point reaches the saturation region or the period of reduced amplification factor can be reduced thus satisfying the condition of initiating oscillations at the time of applying a high source voltage.

While in the above described embodiment an oscillator utilizing a quartz oscillating element has been described it should be understood that this invention is not limited to the utilization of a crystal oscillating element but can be equally applied to any other grounded emitter type oscillator utilizing other types of oscillating elements.

What is claimed is:

1. In a grounded emitter transistor oscillator including:

a transistor ($T_r$) having base, emitter and collector electrodes;

a source of voltage (3) having first (A) and second (B) terminals;

a collector resistor (1) coupling said first terminal (A) of said source to said collector electrode;

a base resistor (21, 22) coupling said base electrode to said first terminal (A);

an emitter resistor (4) coupling said emitter electrode to the second terminal (B) of said source;

an oscillating element (5) coupled between said base and collector electrodes;

the values of said resistors being chosen such that the operating point of the oscillator is set at a low voltage;

the improvement wherein said base resistor is comprised of first (21) and second (22) series coupled resistors, and a capacitor (11) is coupled between the junction (10) of said first and second resistors (21 and 22, respectively), and said source (3) to delay the base current when said source voltage is applied.

2. The oscillator of claim 1 wherein said oscillating element (5) is a quartz element.

3. The oscillator of claim 1 wherein said capacitor (11) is coupled between said junction (10) and the second terminal (B) of said source (3).

References Cited

The following references, cited by the Examiner, are of record in the patented file of this patent or the original patent.

UNITED STATES PATENTS 3,251,007 5/1966 Schmitt _____ 331—116 R

ROY LAKE, Primary Examiner

S. H. GRIMM, Assistant Examiner

U.S. Cl. X.R.

331—164